United States Patent
He et al.

(10) Patent No.: US 7,508,434 B2
(45) Date of Patent: Mar. 24, 2009

(54) IMAGE SENSOR ARCHITECTURE EMPLOYING ONE OR MORE FLOATING GATE DEVICES

(75) Inventors: Fan He, Grayslake, IL (US); Carl L. Shurboff, Grayslake, IL (US)

(73) Assignee: Motorola, Inc., Schaumburg, IL (US)

( * ) Notice: Subject to any disclaimer, the term of this patent is extended or adjusted under 35 U.S.C. 154(b) by 680 days.

(21) Appl. No.: 11/168,945

(22) Filed: Jun. 28, 2005

(65) Prior Publication Data
US 2006/0290798 A1    Dec. 28, 2006

(51) Int. Cl.
*H04N 3/14* (2006.01)
(52) U.S. Cl. .................. 348/308; 348/294; 348/302
(58) Field of Classification Search .......... 348/302, 348/308; 257/225, 233
See application file for complete search history.

(56) References Cited

U.S. PATENT DOCUMENTS

| | | | | |
|---|---|---|---|---|
| 5,608,243 | A * | 3/1997 | Chi et al. | 257/249 |
| 5,625,210 | A * | 4/1997 | Lee et al. | 257/292 |
| 6,049,483 | A * | 4/2000 | Schreck et al. | 365/185.27 |
| 6,064,431 | A * | 5/2000 | Ueno | 348/241 |
| 6,879,340 | B1 | 4/2005 | Chevallier | |
| 6,972,995 | B1 * | 12/2005 | Hopper et al. | 365/185.19 |
| 7,372,495 | B2 * | 5/2008 | Takayanagi et al. | 348/314 |
| 2001/0002848 | A1 * | 6/2001 | Fossum et al. | 348/311 |
| 2004/0056176 | A1 | 3/2004 | Shizukuishi | |

FOREIGN PATENT DOCUMENTS

| | | |
|---|---|---|
| JP | 06215593 | 5/1994 |
| JP | 2003101005 | 4/2003 |

* cited by examiner

*Primary Examiner*—David L Ometz
*Assistant Examiner*—Gary C Vieaux
(74) *Attorney, Agent, or Firm*—Gary J. Cunningham (57) ABSTRACT

A circuit for use in an image sensor as well as an image sensing system using the circuit are set forth. The circuit comprises a floating gate semiconductor device having a floating gate, a control gate, a drain and a source. The circuit also employs a photosensitive semiconductor device that is positioned for exposure to electromagnetic radiation from an image. A pixel control circuit is connected to these components to direct the floating gate semiconductor device and the photosensitive semiconductor device to a plurality of controlled modes. The controlled modes may include an erase mode and an exposure mode. In the erase mode, at least a portion of an electric charge is removed from the floating gate to place the floating gate semiconductor device in an initialized state. In the exposure mode, the floating gate is charged at least partially in response to a voltage at a terminal of the photosensitive semiconductor device. The voltage at the terminal of the photosensitive semiconductor device corresponds to exposure of the photosensitive semiconductor device to the electromagnetic radiation from the image. The pixel control circuit may also direct the floating gate semiconductor device and the photosensitive semiconductor device to further modes including a read mode and a data retention mode. In the read mode, current flow between the source and drain of the floating gate semiconductor device is detected as an indicator of the charge on the floating gate. In the data retention mode, the charge on the floating gate of the floating gate semiconductor device that was acquired during the exposure mode is maintained notwithstanding further exposure of the photosensitive semiconductor device to the electromagnetic radiation from the image. The circuit, and one or more peripheral support circuits, may be implemented in a monolithic substrate using, for example, conventional CMOS manufacturing processes.

20 Claims, 8 Drawing Sheets

IMAGE SENSOR ARCHITECTURE EMPLOYING ONE OR MORE FLOATING GATE DEVICES

TECHNICAL FIELD

The present invention is generally directed to image sensor technology. More particularly, the present invention includes an image sensor architecture employing one or more floating gate devices.

BACKGROUND OF THE INVENTION

CMOS and CCD image sensors have found a wide range of applications in both consumer and industrial products. Such applications include stand-alone digital cameras, night time driving displays for automobiles, computer peripherals, integrated cell phone cameras, etc.

Mobile technology has traditionally focused on the use of CMOS image sensors for image capture. Consumer expectations, however, have driven the market to use high-resolution CMOS image sensor arrays thereby giving rise to a number of problems to the image sensor developer. First, size constraints imposed by mobile technologies require a greater number of pixels per unit area of the array. Pixel size must therefore be decreased in comparison to traditional CMOS pixels. Such decreases in pixel size result in a corresponding reduction in the dynamic range and sensitivity of the pixel. Second, image readout time from such high-resolution image sensor arrays increases with the number of pixels employed in the array. To reduce image degradation resulting from this increase in readout time, an electronic global shutter mechanism should be employed. Pixels employing an electronic global shutter, however, require a large number of components resulting in a corresponding reduction of the pixel fill factor. Accordingly, the present inventors have found a need in the industry for an improved pixel architecture that addresses one or more of these shortcomings.

BRIEF DESCRIPTION OF SEVERAL VIEWS OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
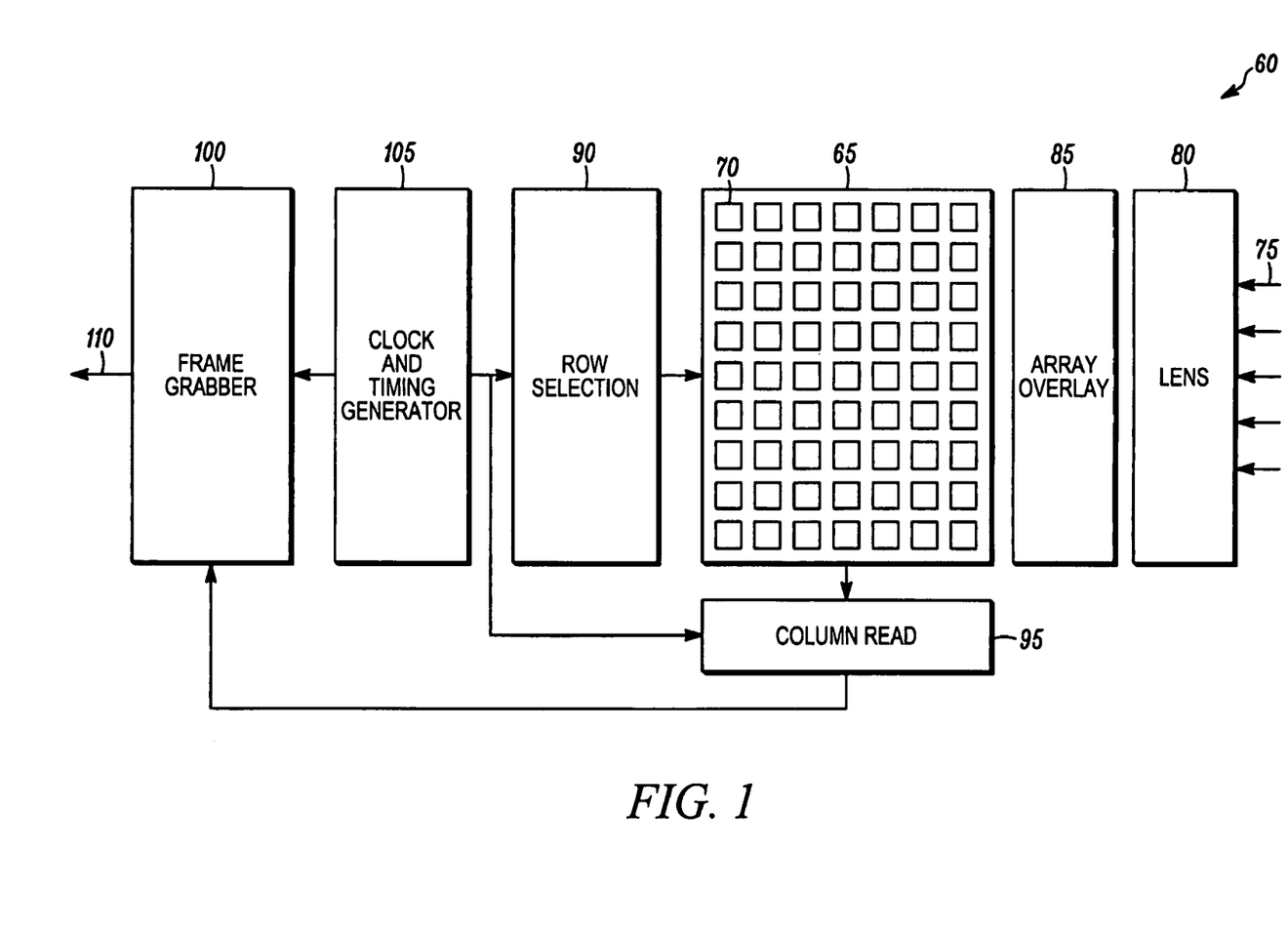
FIG. 1 is a system block diagram of an exemplary embodiment of an image acquisition circuit.

FIG. 1 illustrates an image acquisition system, shown generally at 60, that employs an image array 65 comprising a plurality of pixel circuits 70 constructed in accordance with one exemplary embodiment of the present invention. As shown, the pixel circuits 70 are arranged in the array 65 in a plurality of rows and columns. Each row of pixel circuits 70 may be individually addressed and, if desired, the output signals from an activated row may be read concurrently.

In this exemplary embodiment, electromagnetic radiation 75 from an image source is directed through a lens 80 and array overlay 85 onto photosensitive components of the individual pixel circuits 70. Array overlay 85 may be constructed so that selected pixels are only exposed to certain wavelengths within the spectrum of electromagnetic radiation 75. For example, array overlay 85 may selectively expose predetermined pixels 70 in the array 65 solely to red, green or blue light pursuant to generating a color image.

A row selection circuit 90 is used to activate the readout of the pixel circuits 70 in a given row of the image array 65. The output signals from the pixel circuits 70 in the activated row are provided to a column read circuit 95. Column read circuit 95 may be constructed in any number of different manners. For example, column read circuit 95 may comprise a single correlated double sampling (CDS) circuit that selectively reads individual columns of the array 65 when a single row of the array is selected through the row selection circuit 90. In an alternate exemplary embodiment, a plurality of CDS circuits may be used so that each column of the array 65 (or even fewer than all columns) may be concurrently read by a respective CDS circuit. In other exemplary embodiments, circuits providing a single readout from each pixel circuit 70 during a single read cycle may be employed thereby negating the need for CDS circuitry. Preferably, the analog signals from the pixel circuits 70 are converted by the column read circuit 95 to a digital format which is then arranged into an image frame by a frame grabber 100. Timing for the various operations executed by system 60 is preferably coordinated by a clock and timing generator circuit 105 or the like. Frame grabber 100 may itself execute a number of image processing routines (i.e., image compression, enhancement, etc.) or provide image data at output 114 processing by one or more further systems.

Figure 2:
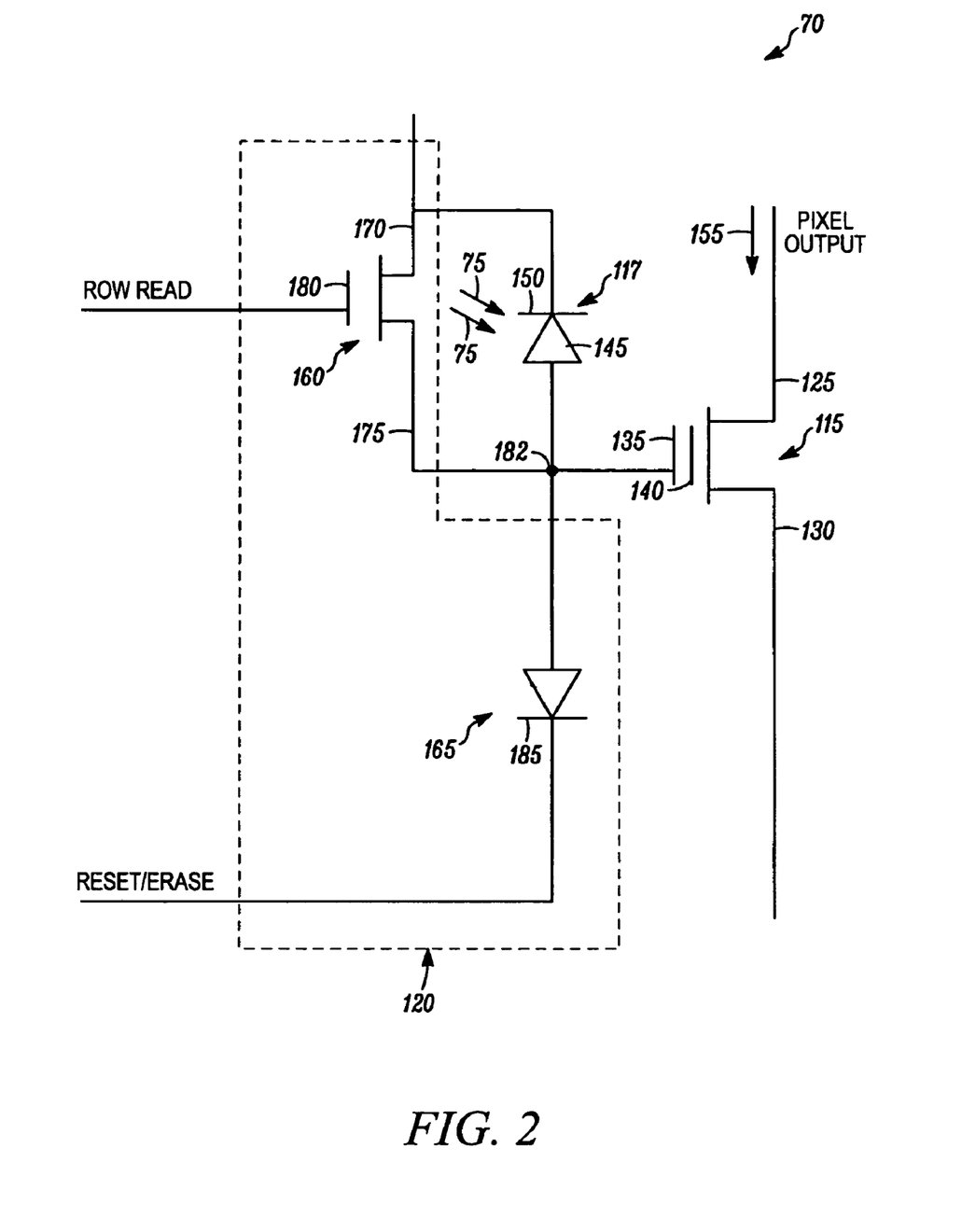
FIG. 2 is an exemplary schematic diagram of one embodiment of an improved pixel architecture.

One embodiment of a pixel circuit 70 suitable for use in the image array 65 of system 60 is shown in FIG. 2. Generally stated, pixel circuit 70 is comprised of a floating gate semiconductor device 115, a photosensitive semiconductor device 117 and a pixel control circuit 120. The floating gate semiconductor device 115 includes a drain 125, a source 130, a control gate 135 and a floating gate 140. In the illustrated exemplary embodiment, the photosensitive semiconductor device 117 may be a pinned photodiode that is positioned for exposure to electromagnetic radiation from an image that is to be detected. The photodiode 117 of the illustrated exemplary embodiment includes an anode 145 and a cathode 150.

The pixel control circuit 120 is connected to direct the floating gate semiconductor device 115 and the photodiode 117 to a plurality of controlled modes. These controlled modes include at least an erase mode and an exposure mode.

In the erase mode, at least a portion of an electric charge is removed from the floating gate 140 of the floating gate semiconductor device 115. The voltage across photodiode 117 may also be raised while in the erase mode. In this manner, both the floating gate semiconductor device 115 and photodiode 117 are placed in an initialized state.

In the exposure mode, the floating gate 140 of the floating gate semiconductor device 115 is charged at least partially in response to a voltage at a terminal of the photosensitive semiconductor device 117. In the illustrated exemplary embodiment, the floating gate 140 is charged at least partially in response to the voltage at the anode 145 of photodiode 117. The voltage at anode 145 is dependent on the degree to which photodiode 117 is exposed to the electromagnetic radiation from the image source. More particularly, there will be a voltage drop across photodiode 117 that corresponds to the electromagnetic radiation exposure. The greater the exposure that photodiode 117 experiences, the greater the voltage drop that will occur across photodiode 117 thereby reducing the voltage at control gate 135.

Pixel control circuit 120 may also direct photodiode 117 and floating gate semiconductor device 115 to a data retention mode. In the data retention mode, the charge on the floating gate 140 acquired during the exposure mode is maintained. Notably, the charge on the floating gate 140 remains generally constant even though the voltage drop across photodiode 117 may change. For example, once the floating gate 140 has been charged during the exposure mode, the charge may be maintained on the floating gate 140 almost indefinitely even if the photodiode 117 continues to be exposed to electromagnetic radiation from the image source.

Pixel control circuit 120 may also direct photodiode 117 and floating gate semiconductor device 115 to a read mode to effectively sense the charge placed on floating gate 140 during the exposure mode. In the illustrated exemplary embodiment, the charge on floating gate 140 alters the threshold voltage $V_T$ of the floating gate semiconductor device 115. Consequently, a predetermined voltage $V_{GS}$ may be provided between the control gate 135 and source 130 of the floating gate semiconductor device 115 to produce a current 155 between the drain 125 and source 130 that corresponds to the charge on floating gate 140.

As shown, pixel control circuit 120 may include a transistor switch 160 and a diode 165. Transistor switch 160 may be a field effect transistor, such as a MOSFET or the like, having a drain 170, source 175 and control gate 180. Control gate 180 is connected to receive a row read signal from, for example, row selection circuit 90 of FIG. 1. The drain 170 and source 175 of MOSFET 160 are respectively connected to the cathode 150 and anode 145 of photodiode 117. Diode 165 includes an anode 180 that is connected to a node 182 that includes the source 175 of MOSFET 160 and the control gate 135 of floating gate semiconductor device 115. Diode 165 also includes a cathode 185 that is connected to receive a reset/erase signal. Various components used to generate the operating voltage levels at the drain 170, drain 125 and source 130 are not illustrated in FIG. 3 but are well within the design capabilities of those skilled in the art given the detailed description of the various controlled modes set forth herein.

FIGS. 3 through 6 show the pixel architecture 70 of FIG. 2 in the various modes of operation discussed above. Exemplary voltage levels for operating in these modes are identified. However, it will be recognized that the specific voltage levels required to operate the pixel architecture 70 in the various modes will depend on the characteristics of the individual devices that are employed.

Figure 3:
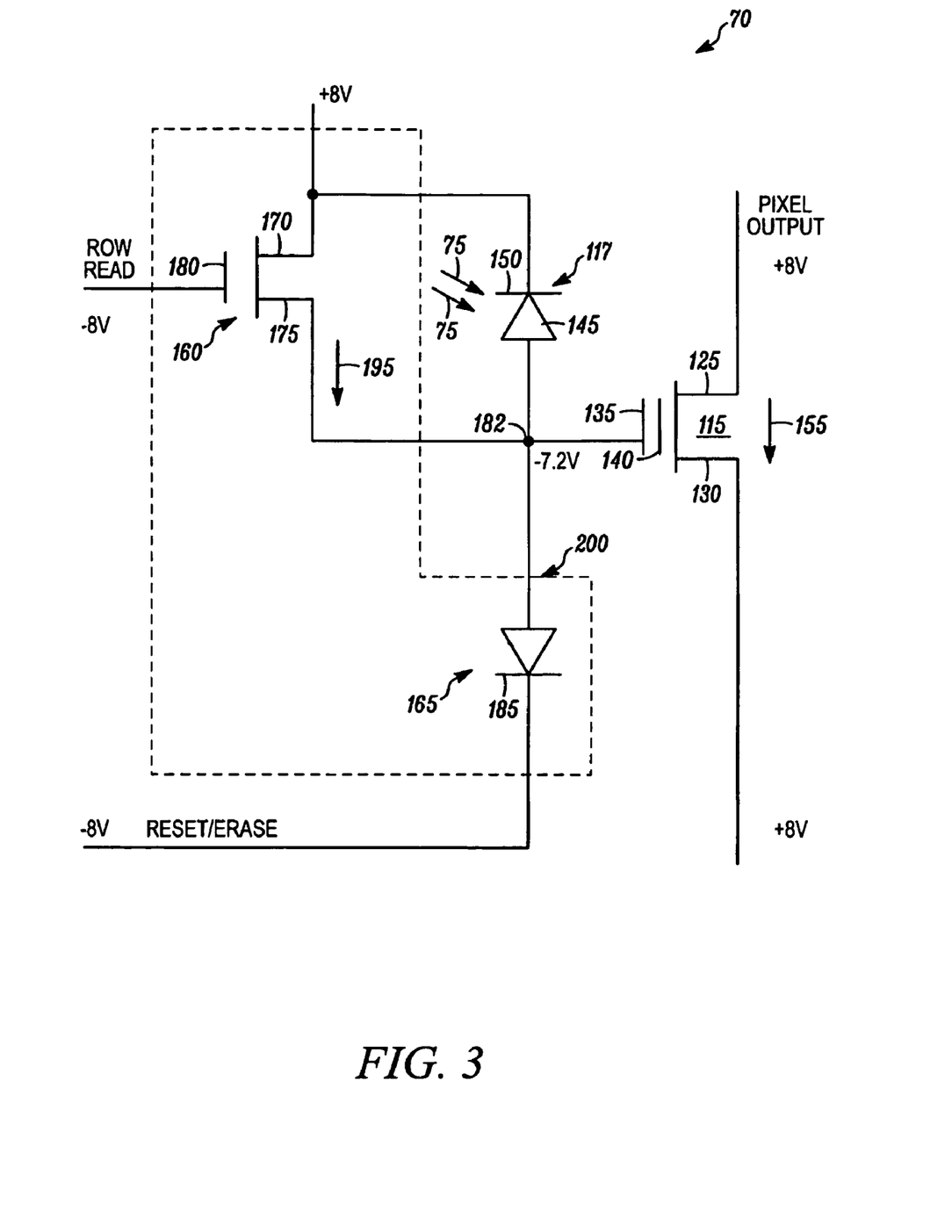
FIG. 3 is an exemplary schematic diagram of the pixel architecture shown in FIG. 2 operating in the erase mode.

FIG. 3 shows the pixel architecture 70 in the erase mode of operation. In this mode, drains 170 and 125 as well as source 130 are driven to +8 V while the row read signal at gate 180 and the reset/erase signal at cathode 185 are driven to −8 V. This places floating gate semiconductor 115 and MOSFET 160 into non-conductive states so that current 155 and current 195 are approximately zero. The diode 165 is forward biased to discharge floating gate 140. At least a portion of the resulting discharge current is depicted at arrow 200. Additionally, photodiode 117 is charged to an initial state with a voltage drop of approximately 15.2 VDC thereacross.

Figure 4:
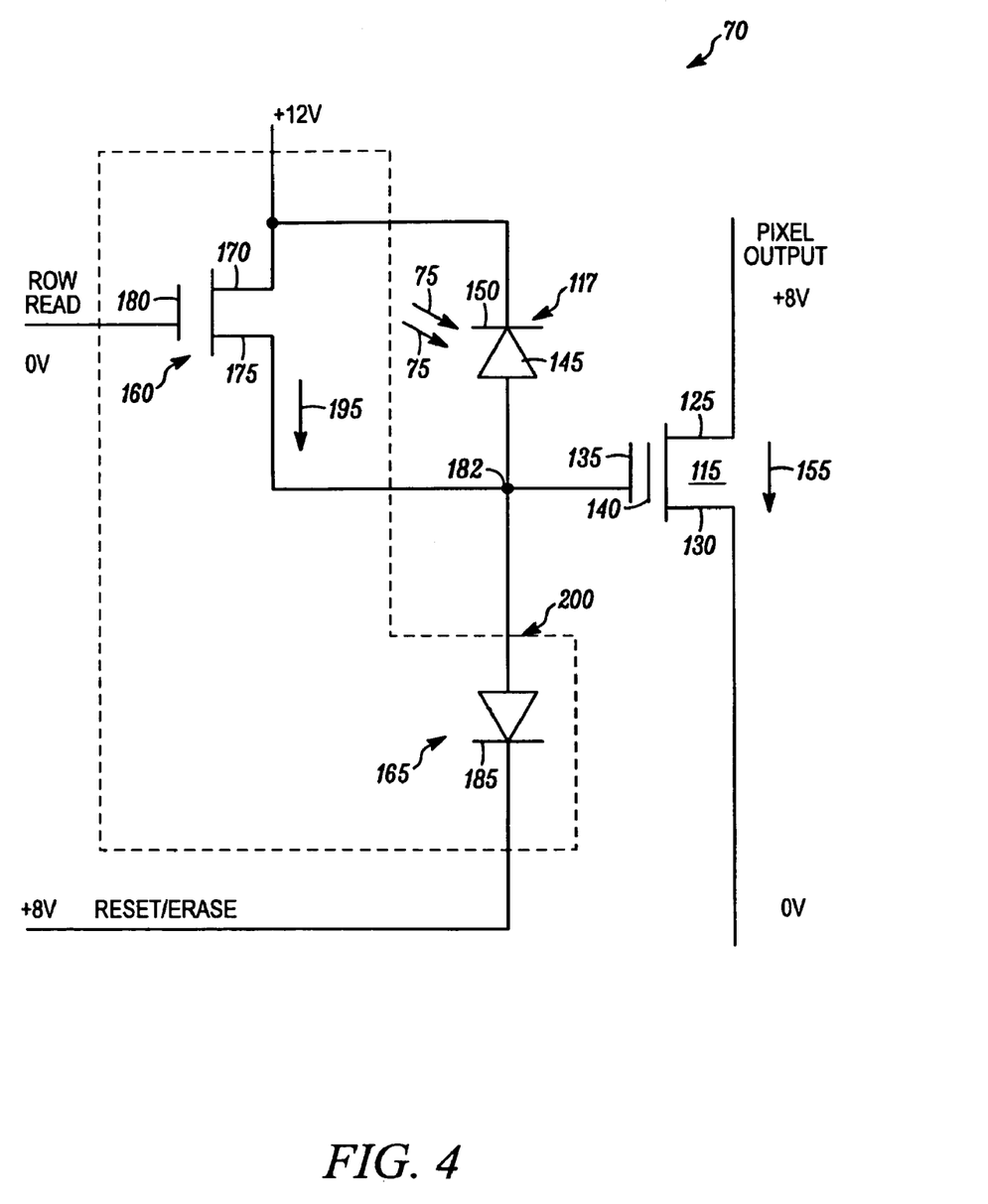
FIG. 4 is an exemplary schematic diagram of the pixel architecture shown in FIG. 2 operating in the exposure mode.

FIG. 4 shows the pixel architecture 70 in the exposure mode of operation. In this mode, drain 125 and cathode 185 are driven to +8 V while the row read signal at gate 180 and source 130 are driven to 0 V. This places MOSFET 160 and diode 165 into non-conductive states so that current 195 and current 200 are approximately zero. Additionally, the voltage levels at drain 170 and cathode 150 are elevated to a "programming voltage" of +12 V. Photodiode 117 is exposed to electromagnetic radiation 75 which causes a corresponding voltage drop between the cathode 150 and anode 145. The voltage at control gate 135 reflects this voltage drop and thus corresponds to the amount of electromagnetic radiation detected at photodiode 117. This control gate voltage, in turn, determines the amount of charge placed on floating gate 140 during the exposure mode.

Figure 5:
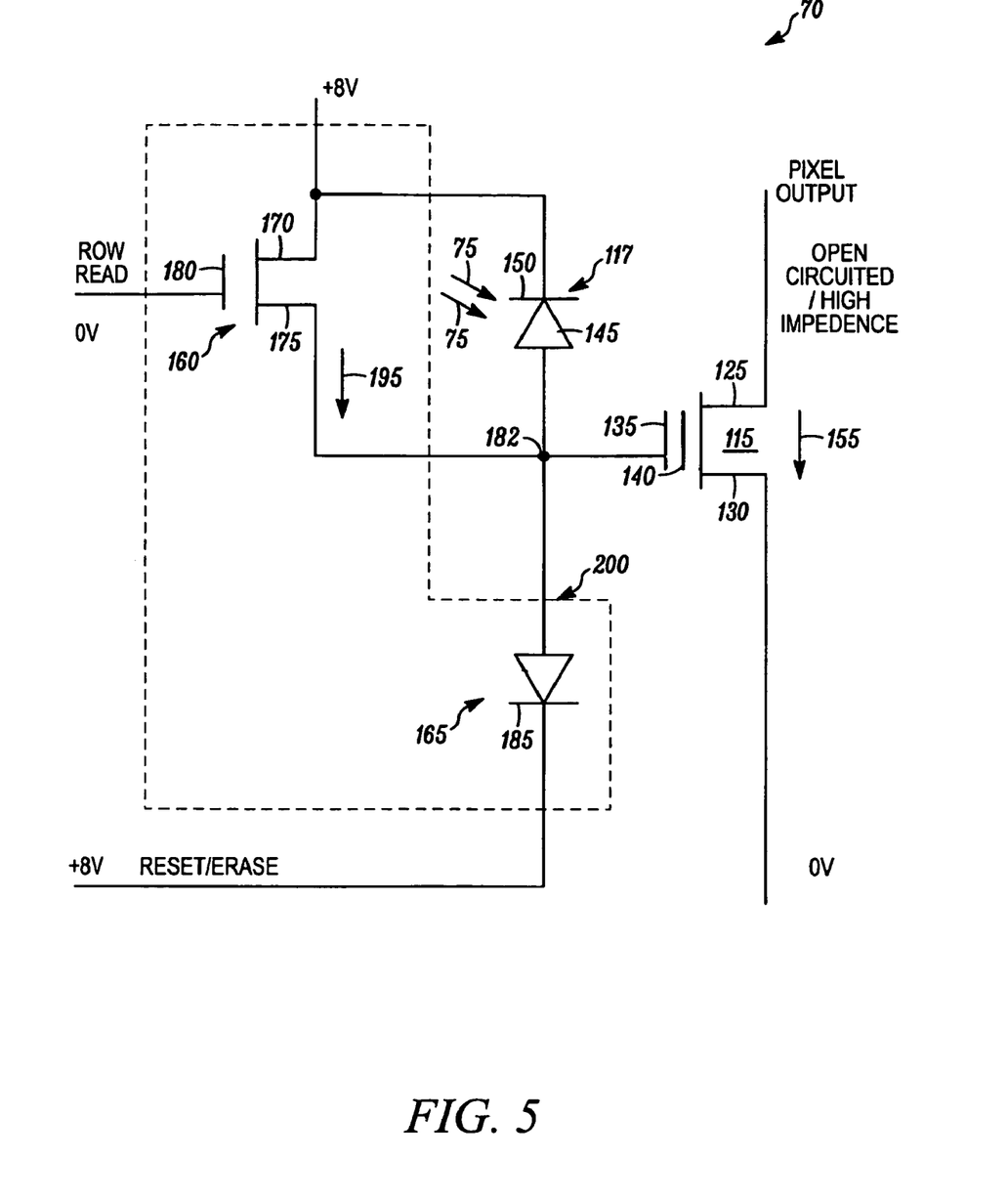
FIG. 5 is an exemplary schematic diagram of the pixel architecture shown in FIG. 2 operating in the data retention mode.

FIG. 5 shows the pixel architecture 70 in the data retention mode of operation. In this mode, drain 125 and cathode 185 are driven to +8 V while the row read signal at gate 180 and source 130 are driven to 0 V. This places MOSFET 160 and diode 165 into non-conductive states so that current 195 and current 200 are approximately zero. The voltage level at cathode 150 of photodiode 117 is reduced to +8 V thereby inhibiting further accumulation of charge on the floating gate 140. Still further, drain 125 is open circuited or otherwise connected to a high impedance load to prevent current flow through the floating gate semiconductor device 115. Current 155 is therefore approximately zero. In this state, the charge on floating gate 140 can remain relatively constant over a prolonged period of time. Since the charge on floating gate 140 can be retained within the individual pixel circuits 70 of the image array 65, the image processing requirements imposed on peripheral circuits, if any, can be relaxed. The cost and complexity of any such image processing peripheral circuits can therefore be reduced, if desired.

Figure 6:
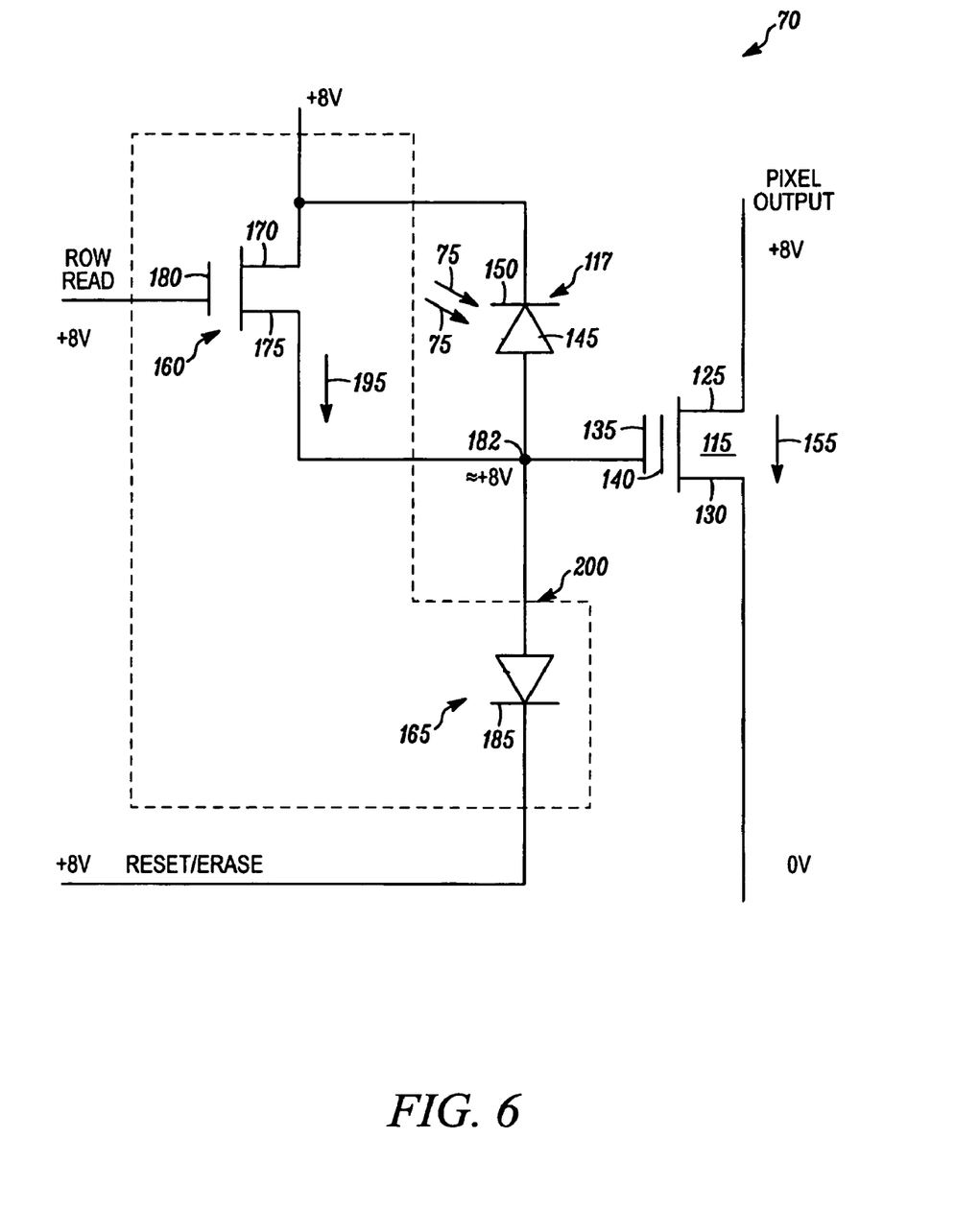
FIG. 6 is an exemplary schematic diagram of the pixel architecture shown in FIG. 2 operating in the read mode.

FIG. 6 shows the pixel architecture 70 in the read mode of operation. In this mode, drains 170 and 125, gate 180 and cathode 185 are driven to +8 V while the source 130 is driven to 0 V. This places control gate 135 at a fixed voltage of approximately +8 V with respect to source 130. As such, $V_{GS}$ is approximately +8 V and the current 155 proceeding through the pixel output corresponds to the charge on floating gate 140. Conversion of current 155 into an appropriate digital signal may take place in the column read circuit 95, which may be implemented in any number of different manners as understood by those of ordinary skill in the art.

Figure 7:
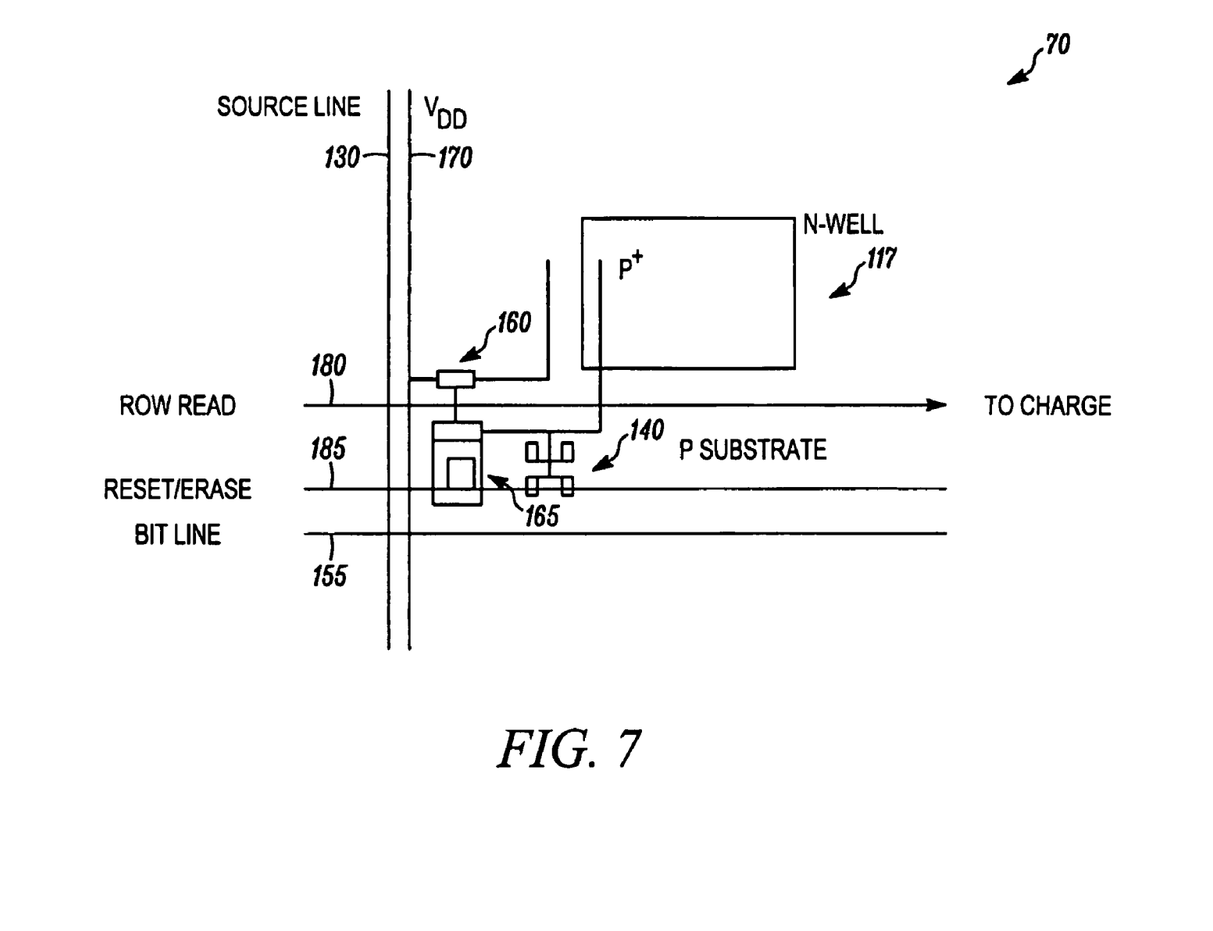
FIG. 7 is an exemplary plan layout for the components of the pixel architecture FIG. 2 in a monolithic substrate.

The pixel architecture 70 is easily implemented in a monolithic substrate. More particularly, the pixel architecture 70 may be readily manufactured using existing CMOS manufacturing processes to form the image array 65 shown in FIG. 1. An exemplary plan layout for the components of pixel architecture 70 in a monolithic substrate is illustrated in FIG. 7. It will be recognized, however, that other layouts may be employed. Further, any of the peripheral components, such as row selection circuit 90, column read circuit 95, frame grabber 100 and clocking and timing generator 105 of FIG. 1 may likewise be integrated with the image array 65 in a monolithic substrate.

Because pixel architecture 70 is centered about a floating gate semiconductor device 115, the pixel, including the components necessary to implement the global reset function, can be implemented with fewer components when compared to a 5T pixel architecture. In the specific pixel circuit architecture shown in FIG. 2, only two transistors 115 and 160 and a single diode 165 are used in conjunction with photodiode 117 thereby facilitating a 2T1D structure. By employing a floating gate semiconductor device 115, it becomes possible to place the pixel circuit 70 into various controlled modes by manipulating the voltage levels provided to the pixel circuit components as opposed to adding further switching transistors to achieve the same operations.

The reduction in the number of components employed to implement the pixel circuit 70 can be used to achieve any number of different objectives. For example, pixel circuit 70 may be manufactured so that its fill factor is comparable to conventional 3T CMOS image sensor architectures. Further, circuit 70 can be implemented so that it has a much higher sensitivity and larger dynamic range when compared with 4T and 5T CMOS image sensor architectures. As disclosed herein, the pixel circuit 70 may employ higher operating voltages during the exposure mode thereby improving the performance of photodiode 117 and rendering it comparable to the performance of similar CCD image sensors.

Pixel circuit 70 may also be implemented so that the read mode of operation is similar to the readout methods employed in conventional CMOS image sensors. For example, each pixel circuit 70 may be individually addressed to achieve the same windowing and sub-sampling advantages that exist in conventional CMOS sensors thereby obviating the need for substantial redesign of corresponding peripheral readout components. Further, the floating gate semiconductor device 115 does not have charge leakage issue and it does not have charge recombination issues as a result of under visible light illumination. Thus it does not have the fading issues associated with the 5T CMOS architecture.

Figure 8:
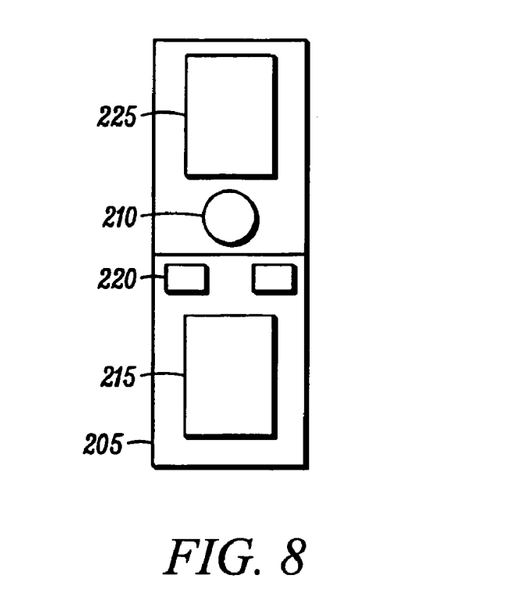
FIGS. 8 and 9 illustrate an exemplary cellular phone having a camera that employs the image acquisition circuitry shown in FIG. 1.
Figure 9:
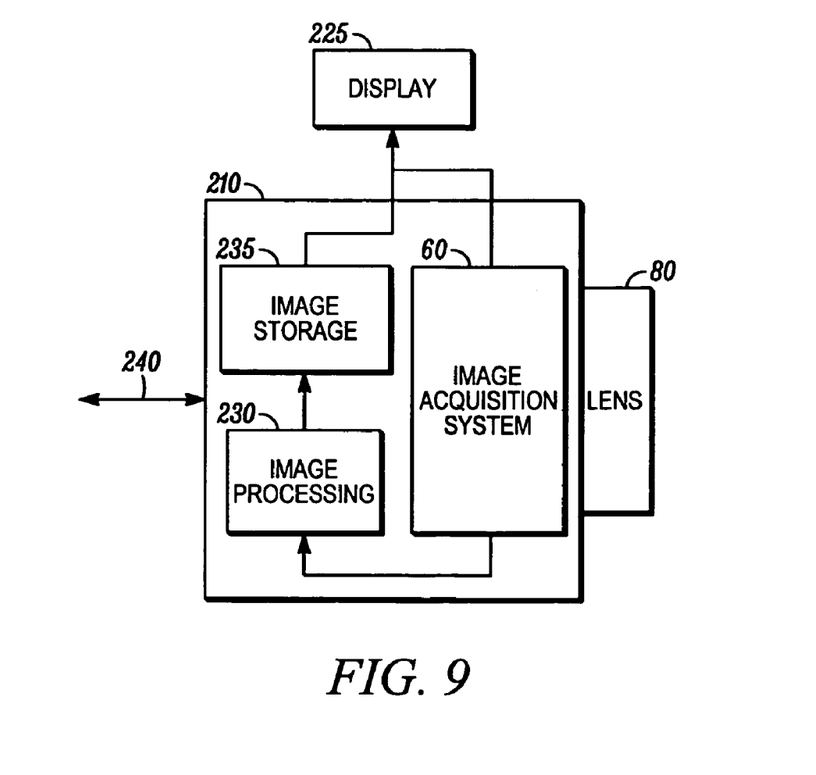

One embodiment of a cellular phone 205 that may include a camera that employs the image acquisition system 60 is shown in FIGS. 8 and 9. As shown, phone 205 includes a camera system 210, a keyboard 215, control keys 220 and a display 225. As noted above, image acquisition system 60 receives electromagnetic radiation from the image source through lens 80. The acquired image can be provided to an on-board image processing system 230 or directly to display 225 (i.e., for viewfinder functionality, etc.). Processed images may be stored in image storage 235 and provided to display 225 in response to user commands. Further, the images in image storage 235 may be read out therefrom for provision to a personal computer or the like via communication link 240.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

The invention claimed is:

1. A circuit for use in an image sensor, the circuit comprising:
   a floating gate semiconductor device having a floating gate, a control gate, a drain and a source;
   a photosensitive semiconductor device positioned for exposure to electromagnetic radiation from an image;
   a pixel control circuit connected to direct said floating gate semiconductor device and said photosensitive semiconductor device to a plurality of controlled modes;
   said photosensitive semiconductor device is a photodiode having an anode and a cathode;
   said pixel control circuit including: a transistor switch connected between said anode and cathode of said photodiode, said transistor switch having a control terminal for controlling the conductive state of said transistor switch; and a diode connected to drain at least a portion of a charge from said floating gate of said floating gate semiconductor device in response to an erase signal;
   said controlled modes including:
      an erase mode in which at least a portion of an electric charge is removed from said floating gate to place said floating gate semiconductor device in an initialized state,
      an exposure mode in which said floating gate is charged at least partially in response to a voltage at a terminal of said photosensitive semiconductor device, said voltage at said terminal corresponding to exposure of said photosensitive semiconductor device to said electromagnetic radiation from said image,
      a data retention mode in which the charge on said floating gate of said floating gate semiconductor device acquired during said exposure mode is maintained thereon notwithstanding further exposure of said photosensitive semiconductor device to said electromagnetic radiation from said image, and
      a read mode in which current flow between said source and drain of said floating gate semiconductor device is detected as an indicator of the charge on said floating gate.

2. A circuit as claimed in claim 1 wherein said controlled modes further include a read mode in which current flow between said source and drain of said floating gate semiconductor device is detected as an indicator of the charge on said floating gate.

3. A circuit as claimed in claim 1 wherein said photosensitive semiconductor device is a photodiode having an anode and a cathode.

4. A circuit for use in an image sensor, the circuit comprising:
   a floating gate semiconductor device having a floating gate, a control gate, a drain and a source;
   a photosensitive semiconductor device positioned for exposure to electromagnetic radiation from an image;
   a pixel control circuit connected to direct said floating gate semiconductor device and said photosensitive semiconductor device to a plurality of controlled modes;
   said photosensitive semiconductor device is a photodiode having an anode and a cathode;
   said pixel control circuit comprises: a FET transistor having a control gate, a drain connected to said cathode of said photodiode, and a source connected to said anode of said photodiode, said source of said FET transistor and said anode of said photodiode being further connected to said control gate of said floating gate semiconductor device; and a diode having an anode connected to said control gate of said floating gate semiconductor device;
   said controlled modes including:
      an erase mode in which at least a portion of an electric charge is removed from said floating gate to place said floating gate semiconductor device in an initialized state,
      an exposure mode in which said floating gate is charged at least partially in response to a voltage at a terminal of said photosensitive semiconductor device, said voltage at said terminal corresponding to exposure of said photosensitive semiconductor device to said electromagnetic radiation from said image, a data retention mode in which the charge on said floating gate of said floating gate semiconductor device acquired during said exposure mode is maintained thereon notwithstanding further exposure of said photosensitive semiconductor device to said electromagnetic radiation from said image, and a read mode in which current flow between said source and drain of said floating gate semiconductor device is detected as an indicator of the charge on said floating gate.

5. A circuit as claimed in claim 4 wherein said erase mode comprises said FET transistor and said floating gate semiconductor device in non-conductive states, said photodiode at an initial voltage state, and said floating gate of said floating gate semiconductor device discharging through said diode.

6. A circuit as claimed in claim 4 wherein said exposure mode comprises said FET transistor and said diode each in a non-conductive state, said cathode of said photodiode raised to an exposure voltage level, and said drain and source of said floating gate semiconductor device having a voltage thereacross sufficient to charge said floating gate in response to voltage levels at said anode of said photodiode.

7. A circuit as claimed in claim 4 wherein said data retention mode comprises said FET transistor and said diode each in a non-conductive state, said cathode of said photodiode at a retention voltage level, and said source of said floating semiconductor device effectively open circuited.

8. A circuit as claimed in claim 4 wherein said read mode comprises a predetermined voltage at said control gate of said floating gate of said floating gate semiconductor device and a current flow between said drain and said source of said floating gate semiconductor device indicative of the charge placed on said floating gate during said exposure mode.

9. An image sensor, said image sensor having a plurality of pixels formed in a monolithic substrate, one or more of said plurality of pixels comprising:

a floating gate semiconductor device having a floating gate, a control gate, a drain and a source;

a photodiode positioned for exposure to electromagnetic radiation from an image;

a FET transistor having a control gate, a drain connected to said cathode of said photodiode, and a source connected to said anode of said photodiode, said source of said FET transistor and said anode of said photodiode being further connected to said control gate of said floating gate semiconductor device;

a diode having an anode connected to said control gate of said floating gate semiconductor device.

10. An image sensor as claimed in claim 9 wherein said image sensor is operable in an erase mode in which said FET transistor and said floating gate semiconductor device are in non-conductive states, said photodiode is at an initial voltage state, and said floating gate of said floating gate semiconductor device is discharged through said diode.

11. An image sensor as claimed in claim 9 wherein said image sensor is operable in an exposure mode in which said FET transistor and said diode are each in a non-conductive state, said cathode of said photodiode is raised to an exposure voltage level, and said drain and source of said floating gate semiconductor device have a voltage thereacross sufficient to charge said floating gate in response to the voltage at said anode of said photodiode.

12. An image sensor as claimed in claim 11 wherein said image sensor is operable in a read mode in which a predetermined voltage is provided at said control gate of said floating gate of said floating gate semiconductor device and a current flow between said drain and said source of said floating gate semiconductor device is indicative of the charge placed on said floating gate during said exposure mode.

13. An image sensor as claimed in claim 9 wherein said image sensor is operable in a data retention mode in which said FET transistor and said diode are each in a non-conductive state, said cathode of said photodiode is lowered to a retention voltage level, and said source of said floating semiconductor device is effectively open circuited.

14. A digital camera comprising:

an image sensor having an array of pixels, one or more of said pixels including a floating gate semiconductor device having a floating gate, a control gate, a drain and a source, a photosensitive semiconductor device positioned for exposure to electromagnetic radiation from an image, a FET transistor having a control gate, a drain connected to said cathode of said photodiode, and a source connected to said anode of said photodiode, said source of said FET transistor and said anode of said photodiode being further connected to said control gate of said floating gate semiconductor device, and a diode having an anode connected to said control gate of said floating gate semiconductor device, a pixel control circuit connected to direct said floating gate semiconductor device and said photosensitive semiconductor device to a plurality of controlled modes, said plurality of controlled modes including an erase mode in which at least a portion of an electric charge is removed from said floating gate to place said floating gate semiconductor device in an initial state for exposure to said electromagnetic radiation, an exposure mode in which said floating gate is charged at least partially in response to a voltage at a terminal of said photosensitive semiconductor device, said voltage at said terminal corresponding to exposure of said photosensitive semiconductor device to said electromagnetic radiation from said image, and a read mode in which a predetermined voltage is provided at said control gate of said floating gate of said floating gate semiconductor device and a current flow between said drain and said source of said floating gate semiconductor device is indicative of the charge placed on said floating gate during said exposure mode, an image sensor readout circuit connected to obtain image data from each of said pixels during said read mode, and a frame grabber connected to arrange image data obtained by said image sensor readout into an image frame.

15. A digital camera as claimed in claim 14 wherein said controlled modes further include a data retention mode in which the charge on said floating gate of said floating gate semiconductor device acquired during said exposure mode is maintained thereon notwithstanding further exposure of said photosensitive semiconductor device to said electromagnetic radiation from said image.

16. A method for operating a pixel in an image sensor, said pixel being comprised of a floating gate semiconductor device having a floating gate, a control gate, a drain and a source, and a photosensitive semiconductor device positioned for exposure to electromagnetic radiation from an image, said method comprising the steps of:

driving said floating gate semiconductor device and said photosensitive semiconductor device into an erase mode in which at least a portion of an electric charge is removed from said floating gate to place said floating gate semiconductor device in an initial state for exposure to said electromagnetic radiation; and driving said floating gate semiconductor device and said photosensitive semiconductor device into an exposure mode in which said floating gate is charged at least partially in response to a voltage at a terminal of said photosensitive semiconductor device, said voltage at said terminal corresponding to exposure of said photosensitive semiconductor device to said electromagnetic radiation from said image, wherein said photosensitive semiconductor device is a photodiode having an anode and a cathode, and wherein said pixel further comprises a FET transistor having a control gate, a drain connected to said cathode of said photodiode, and a source connected to said anode of said photodiode, said source of said FET transistor and said anode of said photodiode being further connected to said control gate of said floating gate semiconductor device, said pixels still further comprising a diode having an anode connected to said control gate of said floating gate semiconductor device, said step of driving said pixel to said erase mode comprising:

driving said FET transistor and said floating gate semiconductor device to non-conductive states;

driving said photodiode to an initial voltage state; and at least partially discharging said floating gate of said floating gate semiconductor device through said diode.

17. A method as claimed in claim 16 and further comprising the step of driving said floating gate semiconductor device and said photosensitive semiconductor device into a data retention mode in which the charge on said floating gate of said floating gate semiconductor device acquired during said exposure mode is maintained thereon notwithstanding further exposure of said photosensitive semiconductor device to said electromagnetic radiation from said image.

18. A method as claimed in claim 16 and further comprising the steps of:

driving said floating gate semiconductor device and said photosensitive semiconductor device into a read mode in which current flow between said source and drain of said floating gate semiconductor device is indicative of the charge on said floating gate; and sensing said current flow between said source and drain of said floating gate semiconductor device.

19. A method as claimed in claim 16 wherein said step of driving said pixel in said exposure mode comprises:

driving said FET transistor and said diode each into a non-conductive state;

driving said cathode of said photodiode to an exposure voltage level; and driving the voltage across said drain and source of said floating gate semiconductor device to a voltage sufficient to charge said floating gate in response to voltage levels at said anode of said photodiode.

20. A method as claimed in claim 19 wherein said step of driving said pixel in said data retention mode comprises:

driving said FET transistor and said diode into non-conductive states, driving said cathode of said photodiode to a retention voltage level, and driving said source of said floating semiconductor device to an effective open circuited state.

* * * * *